«12» United States Patent
Toh et al.

(10) Patent No.: US 10,256,076 B2
(45) Date of Patent: Apr. 9, 2019

(54) SUBSTRATE PROCESSING APPARATUS AND METHODS

(71) Applicant: APPLIED MATERIALS, INC., Santa Clara, CA (US)

(72) Inventors: Shi Wei Toh, Mountain View, CA (US); Avgerinos V. Gelatos, Scotts Valley, CA (US); Vikash Banthia, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/984,935

(22) Filed: Dec. 30, 2015

(65) Prior Publication Data
US 2017/0117118 A1 Apr. 27, 2017

Related U.S. Application Data

(60) Provisional application No. 62/245,076, filed on Oct. 22, 2015.

(51) Int. Cl.
H01L 21/3065 (2006.01)
H01L 21/02 (2006.01)
H01L 21/67 (2006.01)
H01J 37/32 (2006.01)
C23C 16/50 (2006.01)
C23C 16/458 (2006.01)
(Continued)

(52) U.S. Cl.
CPC ...... *H01J 37/32082* (2013.01); *C23C 16/455* (2013.01); *C23C 16/458* (2013.01); *C23C 16/50* (2013.01); *H01J 37/3244* (2013.01); *H01J 37/32449* (2013.01); *H01J 37/32715* (2013.01); *H01L 21/3065* (2013.01); *H01L 21/477* (2013.01); *H01L 21/67248* (2013.01); *H01J 2237/3347* (2013.01)

(58) Field of Classification Search
None
See application file for complete search history.

(56) References Cited

U.S. PATENT DOCUMENTS 6,162,733 A * 12/2000 Obeng ................ H01L 21/3065
                                                                                   134/1.2
6,346,177 B2 * 2/2002 Leiphart ............... B08B 7/0035
                                                                                   134/1.1
(Continued)

Primary Examiner — Stephanie P Duclair
(74) Attorney, Agent, or Firm — Moser Taboada; Alan Taboada

(57) ABSTRACT

Methods of etching include cycles of low temperature etching of a material layer disposed on a substrate, with at least one of the cycles being followed by activation of unreacted etchant deposits during an inert gas plasma treatment. In some embodiments, a method includes: positioning a substrate in a processing chamber; generating, in a first etching cycle, a plasma from a gas mixture within the processing chamber to form a processing gas including an etchant; exposing, to the etchant, a portion of a material layer disposed on a substrate maintained at a first temperature; generating an inert gas plasma within the processing chamber; generating, in a second etching cycle, a plasma from a gas mixture within the processing chamber to form a processing gas including an etchant; and heating the substrate to a second temperature to sublimate a byproduct of reaction between the etchant and the material layer.

18 Claims, 4 Drawing Sheets

(51) Int. Cl.
*C23C 16/455* (2006.01)
*H01L 21/477* (2006.01)

(56) References Cited

U.S. PATENT DOCUMENTS

| | | | |
|---|---|---|---|
| 8,558,299 B2 | 10/2013 | Cao et al. | |
| 8,741,778 B2 | 6/2014 | Yang et al. | |
| 8,801,952 B1 | 8/2014 | Wang et al. | |
| 2007/0218697 A1* | 9/2007 | Chen | H01L 21/02063 438/710 |
| 2009/0104782 A1* | 4/2009 | Lu | H01L 21/31116 438/715 |
| 2011/0151674 A1 | 6/2011 | Tang et al. | |
| 2011/0151676 A1 | 6/2011 | Ingle et al. | |
| 2013/0105303 A1 | 5/2013 | Lubomirsky et al. | |
| 2013/0267098 A1 | 10/2013 | Maeda et al. | |
| 2014/0094036 A1* | 4/2014 | Or | H01L 21/02057 438/715 |
| 2015/0044879 A1* | 2/2015 | Liao | H01L 21/31116 438/715 |
| 2015/0064921 A1 | 3/2015 | Nemani et al. | |
| 2015/0072508 A1 | 3/2015 | Or et al. | |
| 2015/0228495 A1* | 8/2015 | Joubert | H01L 21/67069 438/714 |
| 2015/0262869 A1 | 9/2015 | Naik et al. | |

* cited by examiner

SUBSTRATE PROCESSING APPARATUS AND METHODS

CROSS-REFERENCE TO RELATED APPLICATIONS

This application claims benefit of U.S. provisional patent application Ser. No. 62/245,076, filed Oct. 22, 2015, which is herein incorporated by reference in its entirety.

FIELD

Embodiments of the present disclosure generally relate to substrate processing systems.

BACKGROUND

Integrated circuits are made possible by processes which produce intricately patterned material layers on substrate surfaces. Producing patterned material on a substrate involves the use of controlled methods for removal of exposed material. Chemical etching is used for a variety of purposes including transferring a pattern in photoresist into underlying layers, thinning layers or thinning lateral dimensions of features already present on the surface. Etch processes which etch one material faster than another, for example, can enable a pattern transfer process to proceed more quickly and/or more efficiently. Such etch processes are said to be selective to the first material. As a result of the diversity of materials, circuits and processes, etch processes have been developed with a selectivity towards a variety of materials.

One conventional etch process is a plasma assisted dry etch process which involves the simultaneous exposure of a substrate to $H_2$, $NF_3$, and $NH_3$ plasma by-products. The etch is largely conformal and selective towards silicon oxide layers but does not readily etch silicon regardless of whether the silicon is amorphous, crystalline, or polycrystalline. The selectivity provides advantages for certain applications, such as shallow trench isolation (STI) and inter-layer dielectric (ILD) recess formation.

The above-described etch process produces solid by-products which grow on the surface of the substrate as substrate material is removed. The solid by-products are subsequently removed via sublimation when the temperature of the substrate is raised during an annealing cycle. However, the inventors have observed that as technology shrinks to 32 nm trench widths and 100 nm depths (and beyond), the dimensions of these solid by-products become non-negligible compared with the smallest dimension of the trench. The appreciable size of the solid by-products may pose challenges relating to bottom clean efficiency (BCE), which is determined by the ratio of silicon dioxide removed at the bottom of a trench to the silicon dioxide removed in the top field zone. For example, the inventors herein have observed that when a single etch cycle is followed by a single annealing cycle to obtain one or more 100 nm-scale trenches, the BCE achieved is on the order of about 50% or so.

The inventors herein propose improved methods for etching a material layer.

SUMMARY

Methods of etching include one or more cycles of low temperature etching of a material layer disposed on a substrate, with at least one of the one or more cycles being followed by activation of unreacted etchant deposits during an inert gas plasma treatment.

In some embodiments, a method for etching a material layer disposed on a substrate includes: positioning a substrate in a processing chamber; generating, in a first etching cycle, a plasma from a gas mixture within the processing chamber to form a processing gas including an etchant; exposing, to the etchant, at least a portion of a material layer disposed on the substrate while maintaining the substrate at a first temperature; generating an inert gas plasma within the processing chamber; generating, in a second etching cycle, a plasma from a gas mixture within the processing chamber to form the processing gas including an etchant; and heating the substrate to a second temperature higher than the first temperature, to sublimate at least one byproduct of reaction between the etchant and a material layer disposed on the substrate.

In some embodiments, a method for forming a feature on a substrate by etching a trench with high bottom clean efficiency, includes: positioning the substrate in a vacuum processing region of a processing chamber; during a first etching cycle, exposing at least one portion of the substrate to an etchant while maintaining the substrate below a temperature threshold; and bombarding the at least one portion with ions of an inert gas plasma, while maintaining the substrate below the temperature threshold, to at least one of activate unreacted etchant by the inert gas plasma, physically remove etchant byproducts formed by reaction of the etchant and regions of the at least one portion to reduce top trench overhang and allow fresh etchant to enter the bottom of a trench in a subsequent etching cycle, or anneal away a portion of the etchant byproducts via latent heat of the inert gas plasma to unreacted portions of the substrate reveal fresh surfaces of the substrate at the bottom of a trench and allow more substrate material to be etched at the bottom of the trench. The method further includes heating the substrate to a second temperature higher than the first temperature threshold to sublimate at least one etchant byproduct.

In some embodiments, a plasma processing system for forming a feature on a substrate by etching a trench with high bottom clean efficiency, includes: a processing chamber defining a vacuum processing region and a pumping port for maintaining a selected processing pressure within the vacuum processing region; a substrate support having a substrate receiving surface disposed below the vacuum processing region; an RF power source; and a controller comprising at least one processor and a memory containing instructions executable by the at least one processor to: operate the RF power source, in a first etching cycle, to generate a plasma from a gas or gas mixture within the processing chamber to form a processing gas including an etchant; expose, to the etchant, at least a portion of a material layer of a substrate disposed on the substrate support; operate the RF power source to generate an inert gas plasma within the processing chamber; operate the RF power source, in a second etching cycle, to generate a plasma from a gas mixture within the processing chamber to form the processing gas including the etchant; and maintain the substrate at a temperature effective to sublimate at least one byproduct of reaction between the etchant and a material layer disposed on the substrate.

Additional embodiments and features are set forth in part in the description that follows; and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification

BRIEF DESCRIPTION OF THE DRAWINGS

A further understanding of the nature and advantages of the disclosed embodiments may be realized by reference to the remaining portions of the specification and the drawings.

Figure 1:
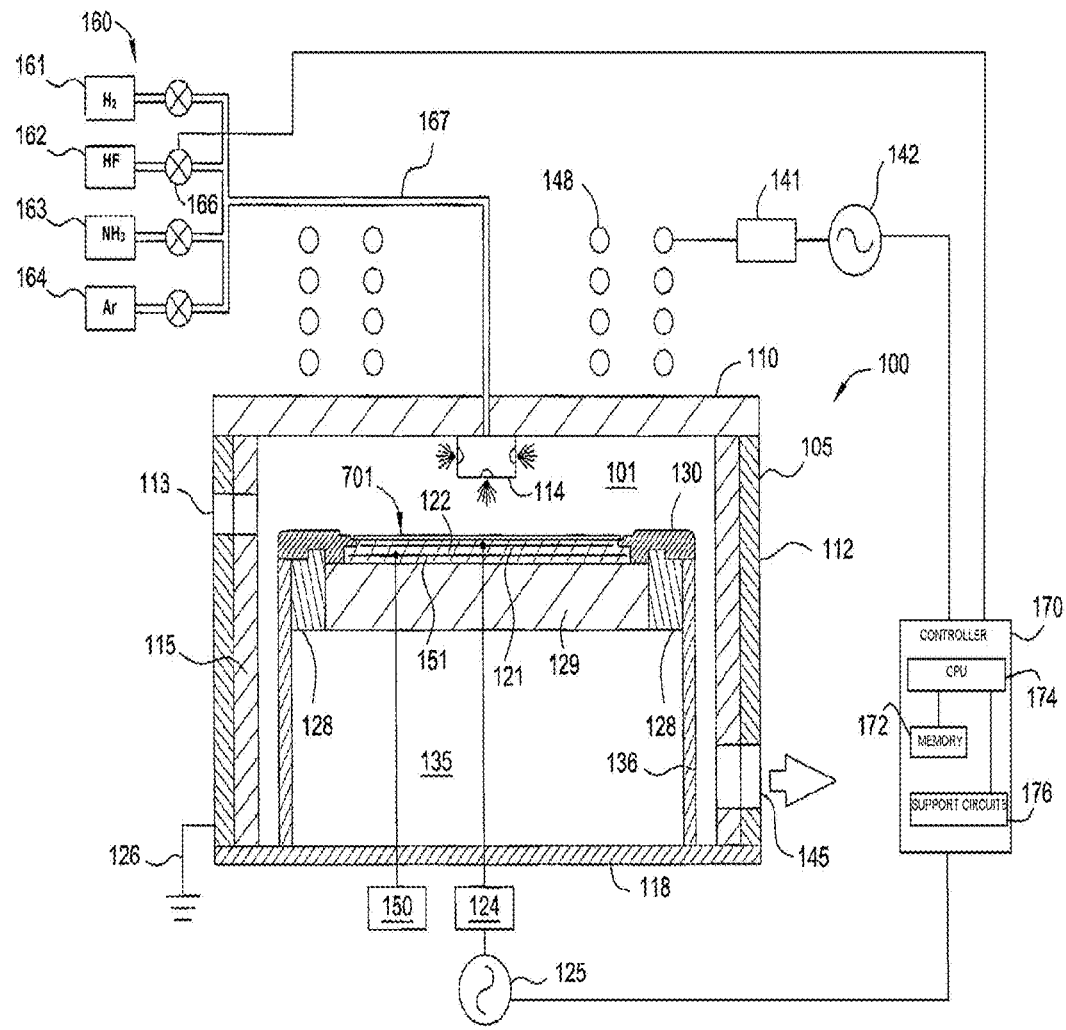
FIG. 1 is a cross section view of an illustrative processing chamber in which embodiments of the present disclosure may be practiced.

To facilitate understanding, identical reference numerals have been used, where possible, to designate identical elements that are common to the figures. The figures are not drawn to scale and may be simplified for clarity. Moreover, elements and features of one embodiment may be beneficially incorporated in other embodiments without further recitation.

DETAILED DESCRIPTION

Methods of etching according to embodiments consistent with the present disclosure include one or more cycles of low temperature etching of a material layer disposed on a substrate, with at least one of the one or more cycles being followed by activation of unreacted etchant deposits during an inert gas plasma treatment. In some embodiments, an etching process includes n low temperature etching cycles and n inert gas plasma treatment(s), where n is an integer greater than or equal to one. In some embodiments, an etching process includes n low temperature etching cycles and n−1 low temperature inert gas plasma treatment(s). In embodiments, the final etching or inert gas plasma treatment is followed by an annealing process during which etchant byproducts are removed from the material layer. Embodiments of the present disclosure advantageously provide for etching with one or more of high throughput, accurate process and profile control, and a high level of bottom clean efficiency.

Each inert gas plasma treatment performed after an etching cycle promotes removal of overhanging etchant byproducts and activation of any unreacted etchant disposed on the material layer, resulting in a highly selective etching process having a bottom clean efficiency (BCE) of about 70 to about 80% when applied to the etching of trenches on the order of 100 nm deep. Because the substrate need not be heated or subjected to prolonged cooling after each etching cycle, however, the throughput rate obtained from embodiments of the present disclosure is comparable to conventional processes.

Not wishing to be bound by theory, the inventors herein theorize that gains in bottom clean efficiency achieved by embodiments consistent with the present disclosure are attributable to at least three distinct phenomenon. First, the latent heat of the inert gas plasma lead to a sublimating/annealing operation. That is, the latent heat of the inert gas plasma anneal the etchant byproduct away to reveal fresh areas of the material layer at the bottom of the trench or other feature being etched. As such, more etchant may react and more of the material layer may be etched at trench bottom. Second, physical collision of inert gas ions remove etchant byproduct which would otherwise create "overhang" to block areas of the trench opening. The physical bombardment of inert gas ions against these areas of overhang facilitate their removal and enable more etchant to enter a trench or other feature being formed in the material layer and reach the bottom where the etchant can react with the material layer. Third, inert gas ions preferentially activate the bottom of a trench or other feature, breaking up the reaction byproduct. For example, where the byproduct is $(NH_4)_2SiF_6$, inert gas "activation" releases F ions from the byproduct deposits at the bottom of the trench to facilitate further etching at the trench bottom.

FIG. 1 is a simplified cutaway view for an exemplary etch processing chamber (processing chamber 100) for etching a material layer disposed on a substrate. The processing chamber 100 is suitable for removing one or more material layers from the substrate 701. One example of a process chamber that may be adapted to implement embodiments consistent with the present disclosure is a CENTURA® ADVANTEDGE® MESA™ etch processing chamber, available from Applied Materials, Inc. of Santa Clara, Calif. The inventors contemplate, however, that other process chambers, including those from Applied Materials, Inc. and other manufacturers, may be adapted to practice embodiments consistent with the present disclosure.

The etching of layers of dielectric material such as silicon oxides (e.g. $SiO_2$) using $NH_4F$ chemistry is commonly practiced in chambers such as the ENDURA® ALPS® chamber using a remote plasma source (RPS) to generate the etchant. However, the inventors herein have determined that the use of a MESA chamber equipped with inductive coupling plasma (ICP) coils according to one or more embodiments, accommodates efficient performance of both the etching cycles and the plasma treatment cycle(s).

In an embodiment, the processing chamber 100 is an ICP plasma processing chamber and includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the processing chamber 100. The dimensions of the chamber body 105 and related components of the processing chamber 100 are not limited and generally are proportionally larger than the size of the substrate 701 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 701 into and out of the processing chamber 100. The substrate access port 113 may be coupled to a transfer chamber and/or other chambers of a substrate processing system (not shown).

A pumping port 145 is formed through the sidewall 112 of the chamber body 305 and connected to the chamber volume 101. A pumping device, (not shown) is coupled through the pumping port 145 to the chamber volume 101 to evacuate and control the pressure therein. The pumping device may include one or more vacuum pumps and throttle to regulate flow of gases through the processing chamber 100. The terms "gas" and "gases" are used interchangeably, unless otherwise noted, and refer to one or more precursors, reactants, catalysts, carrier, purge, cleaning, combinations thereof, as well as any other fluid introduced into the chamber body 105.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if appropriate. Examples of process gases that may be provided by the gas panel 160 include, but are not limited to, chlorine, fluorine, oxygen and hydrogen containing gases such as $H_2$, HF, $NH_3$, and BCl, among others, and inert gases such as helium (He), neon (Ne), Argon (Ar) and Krypton (Kr).

Valves 166 control the flow of the process gases from the process gas sources 161, 162, 163, 164 from the gas panel 160 and are managed by a system controller 170. System controller can be used to regulate the operations of the processing chamber 100, operating under the control of a computer program stored in memory 172 and executed by at least one processor, such as central processing unit (CPU) 174. The computer program may include instructions that enable the process described below to be performed in the processing chamber 100. For example, the computer program may dictate the process sequencing and timing, mixture of gases, chamber pressures, RF power levels, valve opening and closing, substrate cooling or heating, and other parameters of a particular process. The flow of the gases supplied to the chamber body 105 from the gas panel 160 may include combinations of the gases.

The chamber lid assembly 110 may include a nozzle 114. The nozzle 114 has one or more ports for introducing the process gases from the process gas sources 161, 162, 163, and/or 164 of the gas panel 160 into the chamber volume 101. After the process gases are introduced into the processing chamber 100, the gases are energized to form plasma. An antenna 148, such as one or more inductor coils, may be provided adjacent to the processing chamber 100. An antenna power supply 142 powers the antenna 148 through a matching circuit 141 to inductively couple energy, such as RF enemy, to the process gases to maintain a plasma formed from the process gases in the chamber volume 101 of the processing chamber 100.

In embodiments, the antenna power supply 142 is an RF power source. The signal generated by the antenna power supply 142 is delivered through matching circuit 141 through a single feed to ionize, via inductive coupling, the gas mixture provided in the processing chamber 100 and to provide ion energy sufficient to perform one or more plasma enhanced processes consistent with embodiments of the present disclosure. In an embodiment, the antenna power supply 142 is capable of producing an RF signal having a frequency of from about 50 kHz to about 200 MHz and a power between about 0 Watts and about 5000 Watts. Additional power sources may be coupled to the antenna 148 to control the characteristics of the plasma as appropriate.

Alternatively, or in addition to the antenna power supply 142, process electrodes below the substrate 701 and/or above the substrate 701 may be used to capacitively couple RF power to the process gases to maintain the plasma within the chamber volume 101. In embodiments, the operation of the antenna power supply 142 is controlled by a controller, such as system controller 170, which also controls the operation of other components in the processing chamber 100.

A substrate support 135 is disposed in the chamber volume 101 to support the substrate 701 during processing. The substrate support 135 may include a chuck for holding the substrate 701 during processing. In one or more embodiments, the substrate 701 may be secured to the substrate support 135 using a vacuum chuck. In other embodiments, an electro-static chuck (ESC) 122 may be used, employing electro-static attraction to hold the substrate 701 to the substrate support 135. The ESC 122 is powered by an RF power supply 125 integrated with a match circuit 124. The ESC 122 comprises an electrode 121 embedded within a dielectric body. The RF power supply 125 may provide a RF chucking voltage of about 200 volts to about 2000 volts to the electrode 121. As noted previously, the operation of RF power supply 125 may be controlled by system controller 170. Moreover, system controller 170 may control the operation of the electrode 121 by directing a DC current to the electrode 121 for chucking and de-chucking the substrate 701.

The ESC 122 may also include an electrode 151 deposed therein. The electrode 151 is coupled to a power source 150 and provides a bias which attracts plasma ions, formed by the process gases in the chamber volume 101, to the ESC 122 and substrate 701 positioned thereon. The power source 150 may cycle on and off, or pulse, during processing of the substrate 701. The ESC 122 has an isolator 128 for the purpose of making the sidewall of the ESC 122 less attractive to the plasma to prolong the maintenance life cycle of the ESC 122. Additionally, the substrate support 135 may have a cathode liner 136 to protect the sidewalls of the substrate support 135 from the plasma gases and to extend the time between maintenance of the processing chamber 100.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 701 disposed thereon. In embodiments, the ESC 122 is configured to perform in the temperature range appropriate for low temperature etching of a silicon oxide layer disposed on substrate 701, for subsequent inert gas pre-treatment/activation of unreacted, deposited etchants, and for a final substrate annealing process to accommodate removal of etchant byproducts via sublimation. The ESC 122 may be configured to maintain the substrate 701 at a temperature of about minus about 25 degrees Celsius to about 100 degrees Celsius for certain embodiments.

The cooling base 129 may be provided to assist in controlling the temperature of the substrate 701. For example, the temperature of the substrate 701 may be maintained at a substantially constant first temperature by the cooling base 129 during the time a silicon oxide etching cycle is being performed. In one embodiment, the substantially constant first temperature at which the substrate 701 is maintained throughout a silicon oxide etch cycle is between about 30 to about 50 degrees Celsius.

A cover ring 130 is disposed on the ESC 122 and along the periphery of the substrate support 135. The cover ring 130 is configured to confine etching gases to an appropriate portion of the exposed top surface of the substrate 701, while shielding the top surface of the substrate support 135 from the plasma environment inside the processing chamber 100. Lift pins (not shown) are selectively moved through the substrate support 135 to lift the substrate 701 above the substrate support 135 to facilitate access to the substrate 701 by a transfer robot (not shown) or other suitable transfer mechanism.

As noted previously, the system controller 170 may be utilized to control the process sequence, regulating the gas flows from the gas panel 160 into the processing chamber 100 and other process parameters. Software routines in memory 172, when executed by the CPU 174, transform the CPU 174 into a specific purpose computer (controller) that controls the processing chamber 100 such that the processes are performed in accordance with embodiments of the present disclosure. The software routines may also be stored and/or executed by a second controller (not shown) that is collocated with the processing chamber 100. Support circuits 176 facilitate various interface functions associated with execution of the software routines by CPU 174.

Figure 2:
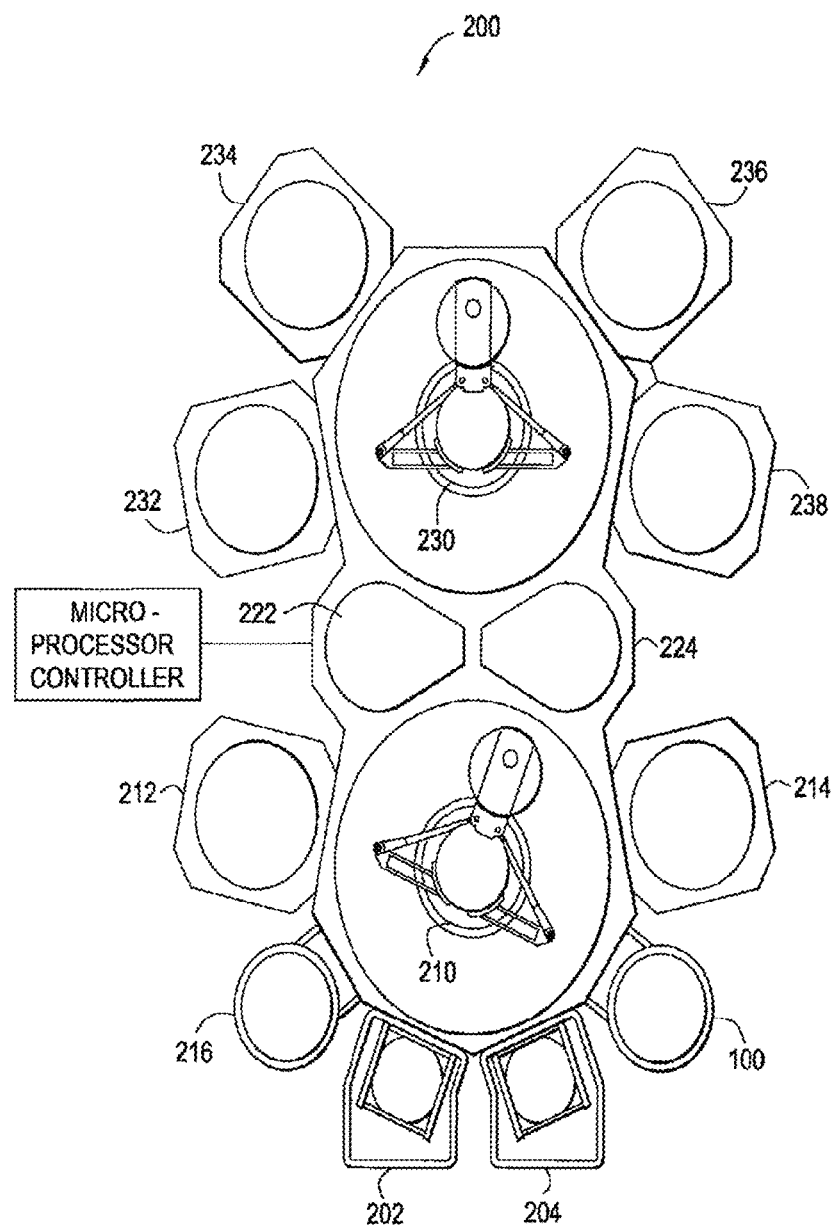
FIG. 2 is a schematic top-view diagram of an illustrative multi-chamber processing system.

FIG. 2 is a schematic top-view diagram of an illustrative multi-chamber processing system (system 200) that can be adapted to perform processes as disclosed herein having the processing chamber 100 coupled thereto. The system 200 can include one or more load lock chambers 202, 204 for transferring substrates into and out of the system 200. Typically, since the system 200 is under vacuum, the load lock chambers 202, 204 can "pump down" the substrates being introduced into the system 200. A first robot 210 can transfer the substrates between the load lock chambers 202, 204, and a first set of one or more processing chambers 212, 214, 216, 100 (four are shown). Each of processing chambers 212, 214, 216, 100 is configured to perform at least one substrate processing operation, such as a pre-clean process, an etching process, cyclical layer deposition (CLD), atomic layer deposition (ALD), chemical vapor deposition (CVD), physical vapor deposition (PVD), degas, orientation and other substrate processes. The position of the processing chamber 100 utilized to perform the etching process relative to the other processing chambers 212, 214, 216 is for illustration, and the position of the processing chamber 100 may be optionally be switched with any one of the processing chambers 212, 214, 216 if appropriate.

The first robot 210 can also transfer substrates to/from one or more transfer chambers 222, 224. The transfer chambers 222, 224 can be used to maintain ultra-high vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 214, 216, 100, the processing chambers 232, 234, 236, 238 can be outfitted to perform a variety of substrate processing operations including the dry etch processes described herein any other suitable process including deposition, pre-clean, degas, and orientation, for example. Any of the processing chambers 212, 214, 216, 100, 232, 234, 236, 238 can be removed from the system 200 if not appropriate for a particular process to be performed by the system 200.

Figure 3:
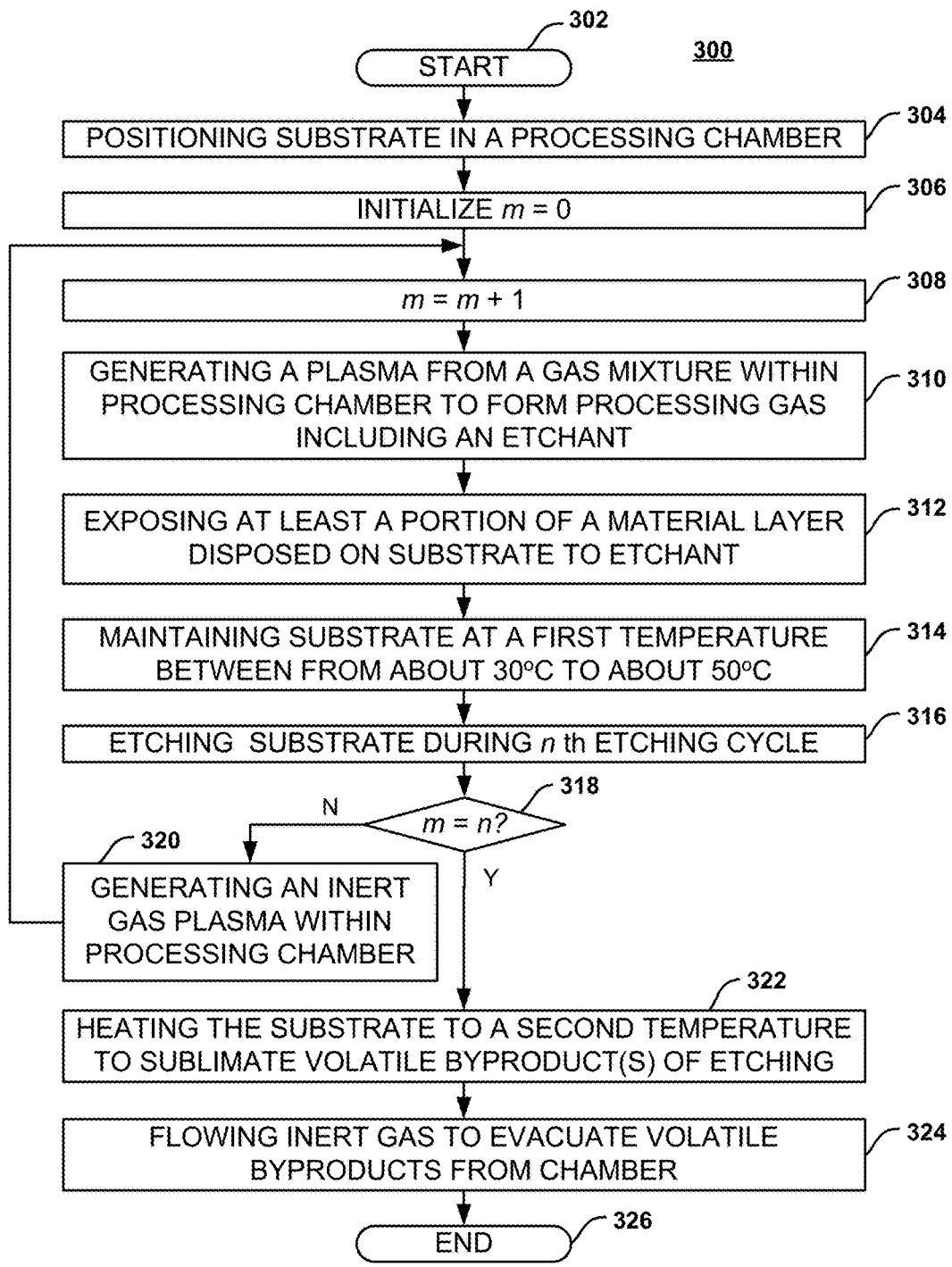
FIG. 3 depicts a flow diagram for etching a material layer using a low temperature etching process followed by a low temperature plasma anneal process in accordance with one embodiment of the present disclosure.

FIG. 3 illustrates a process sequence 300 used to perform an etching process to etch a material layer disposed on a substrate with high etching selectivity and higher bottom clean efficiency as compared to a conventional processes. The sequence described in FIG. 3 corresponds to the fabrication stages depicted in FIG. 4A-4G, which illustrates schematic cross-sectional views of a substrate 402 having a material layer 404 formed thereon during successive cycles of etching the material layer 404.

Figure 4A:
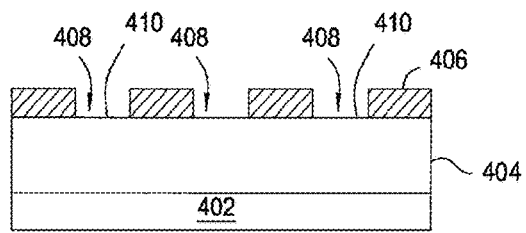
FIGS. 4A-4G depict cross-sectional views of a material layer disposed on a semiconductor substrate over a sequence for etching the material layer in accordance with one embodiment of the present disclosure.

The process sequence 300 is entered at start block 302 and proceeds to block 304. At block 304, a substrate, such as the substrate 402 depicted in FIG. 4A, is positioned into a processing chamber, such as the processing chamber 100 depicted in FIG. 1, or other suitable processing chamber. The substrate 402 may have a substantially planar surface, an uneven surface, or a substantially planar surface having a structure formed thereon. In embodiments, the processing chamber is capable of maintaining the substrate at a specific temperature, biasing the substrate, and forming an etchant such, for example, as $NH_4F$ in a plasma (e.g., creating $NH_4F$ in an inductively coupled plasma).

The substrate 402 shown in FIG. 4A includes a material layer 404 formed on the substrate 402. In one embodiment, the substrate 402 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 402 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

In one embodiment, the material layer 404 may be utilized to form a gate structure, shallow trench isolation (STI) structure, a contact structure or an interconnection structure in the front end or back end processes. In one embodiment, the process sequence 300 may be performed on the material layer 404 to form a shallow trench isolation (STI) structure therein, with a typical trench having a depth on the order of 100 nm. The material layer 404 may be a dielectric layer, for example, selected from a group consisting of an oxide layer, a nitride layer, a titanium nitride layer, a composite of oxide and nitride layer, at least one or more oxide layers sandwiching a nitride layer, and combinations thereof, amongst others. Other suitable materials for the material layer 404 also include undoped silicon glass (USG), such as silicon oxide or TEOS, boron-silicate glass (BSG), phosphorus-silicate glass (PSG), boron-phosphorus-silicate glass (BPSG) and combinations thereof. In an exemplary embodiment depicted herein, the material layer 404 is an undoped silicon glass (USG) layer. In one embodiment, the material layer 404 has a thickness between about 100 Å to about 15000 Å, such as between about 200 Å to about 5000 Å, for example about 2000 Å.

A patterned mask layer (mask layer 406) is disposed on the material layer 404. The patterned mask layer 406 has an open feature 408 that exposes portions of the material layer 404 for etching. In one embodiment, the mask layer 406 may be a hard mask layer, a photoresist mask or a combination thereof. The open feature 408 in the mask layer 406 is used as an etch mask to form open features 416 in the material layer 404 with appropriate aspect ratio and profile. The open features 416 described herein may include trenches, vias, openings and the like. In one embodiment wherein the mask layer 406 is a hardmask layer, the mask layer 406 may be a material selected from a group consisting of silicon, silicon oxide, silicon nitride, silicon oxynitride, silicon carbide, amorphous carbon, and combinations thereof. In some embodiments, the mask layer 406 may be a patterned photoresist layer, such as a lithographically patterned mask. The photoresist layer may is a positive tone photoresist, a negative tone photoresist, a UV lithography photoresist, an i-line photoresist, an e-beam resist (for example, a chemically amplified resist (CAR)) or other suitable photoresist.

In some embodiments, an n cycle etching process is performed on the substrate 402 to etch the material layer 404 on the substrate 402, where n is an integer equal to or greater than one. At block 306, the process sequence 300 is initialized by setting the etch cycle counter m to zero. From block 306, the process sequence 300 proceeds to block 308, where the cycle counter m is incremented by one. The process sequence 300 proceeds to block 310.

Figure 4B:
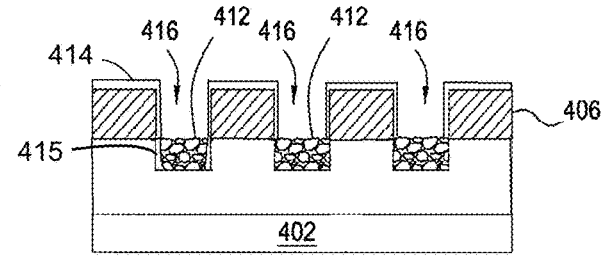

At block 310, a cycle of the n-cycle plasma etching process is initiated on the substrate 402 to etch the material layer 404 on the substrate 402, as shown in FIG. 4B. To that end, embodiments of processing sequence 300 include generating, at block 310, a plasma from a gas mixture within the processing chamber to form a processing gas that includes an etchant and exposing to the etchant, at block 312, at least a portion of the material layer 404 disposed on the substrate 402. At block 314, the substrate as substrate 402 is maintained at a first temperature between from about 30° C. to about 70° C., while at block 316 the reaction of the etchant formed at block 310 proceeds to etch the material layer 404 of substrate 402. In some embodiments, the substrate is maintained at a first temperature between from about 30° C. to about 50° C., and in an embodiment, the substrate is maintained at a first temperature between from about 30° C. to about 40° C.

In one embodiment, the etching gas mixture used to remove the material layer 404 is a mixture of ammonia ($NH_3$) and nitrogen trifluoride ($NF_3$) gases. The amount of each gas introduced into the processing chamber may be varied and adjusted to accommodate, for example, the thickness of the material layer 404 to be removed, the geometry of the substrate being processed, the volume capacity of the plasma cavity, the volume capacity of the chamber body, as well as the capabilities of the vacuum system coupled to the chamber body.

As the plasma is generated in the processing chamber, the etchant(s) dissociated from the etching gas mixture from the plasma is relatively mild and gentle, so as to slowly, gently and gradually chemically react with exposed portions of material layer 404. In an embodiment, ammonia ($NH_3$) gas and the nitrogen trifluoride ($NF_3$) gas are dissociated in the processing chamber as an inductively coupled plasma, forming ammonium fluoride ($NH_4F$) and/or ammonium fluoride with HF ($NH_4F.HF$).

In one or more embodiments, the etching gas(es) dissociated in the processing chamber may comprise one hundred percent $NH_3$, one hundred percent $NF_3$ or $NF_3$ together with $NH_3$ according to any molar ratio in between. In one embodiment, a 1:1 molar ratio of ammonia ($NH_3$) to nitrogen trifluoride ($NF_3$) is introduced into and disassociated within the processing chamber. In other embodiments, the molar ratio of the etching gas mixture is at least about 3:1 (ammonia to nitrogen trifluoride). The gases are introduced in the processing chamber 100 at a molar ratio of from about 5:1 (ammonia to nitrogen trifluoride) to about 30:1. In yet another embodiment, the molar ratio of the etching gas mixture is from about 5:1 (ammonia to nitrogen trifluoride) to about 10:1. The molar ratio of the etching gas mixture can also fall between about 10:1 (ammonia to nitrogen trifluoride) and about 20:1.

In one embodiment, other types of gas, such as inert gas or carrier gas, may also be supplied in the etching gas mixture to assist carrying the etching gas mixture into the vacuum processing region of the processing chamber 100. Suitable examples of the inert gas or carrier gas may include at least one of Ar, He, $N_2$, $O_2$, $N_2O$, $NO_2$, NO, or the like. In one embodiment, the inert or carrier gas which may be supplied into the vacuum processing region of the processing chamber 100 is Argon (Ar) and/or Helium (He) and/or Krypton (Kr) at a volumetric flow rate of between about 200 standard cubic centimeters per minute (sccm) and about 1500 sccm.

In one embodiment, the gas mixture from which the process gas mixture is formed at block 310 is flowed for a duration of 10 seconds during each of three etching cycles (n=3) and includes 100 sccm $NF_3$, 300 sccm $NH_3$, 700 sccm Ar, and 300 sccm He, with an RF ICP source power of 300 watts, a vacuum processing region pressure of 300 millitorr (mTorr) and a substrate temperature of 30° C. In another embodiment, the gas mixture from which the process gas mixture is formed at block 310 is flowed for a duration of 15 seconds during each of two etching cycles (n=2) and includes 100 sccm $NF_3$, 300 sccm $NH_3$, 700 sccm Ar, and 300 sccm He, with an RF source power of 300 W and a chamber volume pressure of 300 mTorr.

Figure 4C:
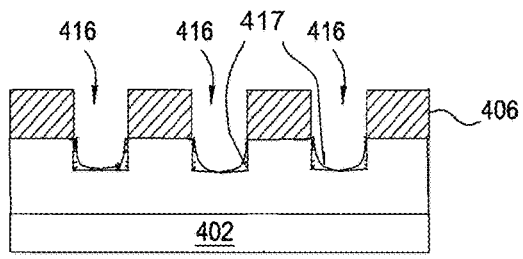
Figure 4D:
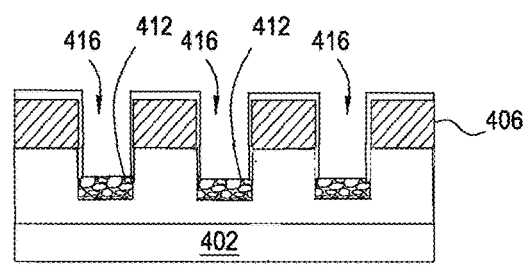
Figure 4E:
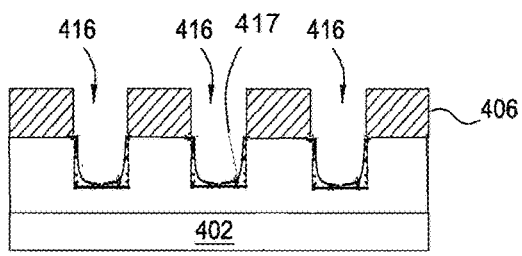
Figure 4F:
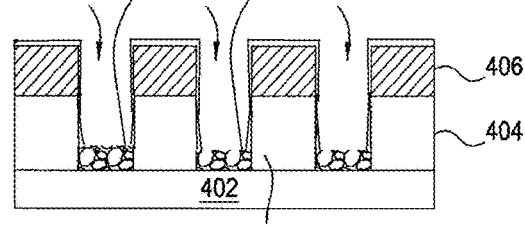

Once the etchants of ammonium fluoride ($NH_4F$) and ammonium fluoride with HF ($NH_4F.HF$) are introduced into the processing region of the processing chamber, reaching upon the substrate surface, they may react with the dielectric materials, such as silicon oxide, to form the reaction byproduct $(NH_4)_2SiF_6$ in a solid state. As such, these etchants chemically react with portions of the material layer 404 during each etching cycle to form the reaction byproduct $(NH_4)_2SiF_6$, in solid state form, in lower portions of trenches 416 as shown in FIGS. 4B, 4D and 4F, respectively.

At block 314, while supplying the etching gas mixture to perform the plasma etching process, a substrate temperature may be maintained at a low range, such as less than about 70 degrees Celsius, such as between about 30 degrees Celsius and about 50 degrees Celsius. Maintaining the substrate temperature at a low range, such as less than 50 degrees Celsius, promotes an increased the etching rate of the etching process as compared to higher substrate temperatures. At such higher substrate temperatures, the chemical reaction between ammonia ($NH_3$) and nitrogen trifluoride ($NF_3$) slows. As a result, the intended etchants, ammonium fluoride ($NH_4F$) and/or ammonium fluoride with HF ($NH_4F.HF$), are formed at a slower rate. As nitrogen trifluoride ($NF_3$) is relatively thermodynamically stable at elevated temperatures, a low temperature utilized during the etching process may favor surface adsorption of plasma of plasma species onto the material layer 404 being etched. Controlling the substrate temperature to a range between from about 0° Celsius to about 60° Celsius may enhance the etching rate during the etching process and increase the overall etching process throughput.

Not wishing to be bound by theory, the inventors herein believe that some portions of the etchant gas $NH_4F$ or $NH_4F.HF$ generated during one or more of the n etching cycles, indicated generally at 415 in FIG. 4B, are not able to reach or react with surfaces of the material layer 404 and do not react with the material layer 404. To facilitate such reaction, at least some of the etching cycles are followed by a cycle of inert gas plasma treatment. In an embodiment, process sequence 300 includes n−1 inert gas plasma treatments. In embodiments, processing sequence 300 includes, at block 318, determining if the final etching cycle has been performed and, if not, at block 320, flowing an inert gas or mixture of inert gas into the vacuum processing region of the processing chamber. The inert gas or inert gas mixture may include, for example, He, Ar, or Kr. In an embodiment, an inert gas inductively coupled plasma is generated for five to twenty-five seconds, between consecutive ten to fifteen second etching cycles, from Ar flowing at a volume of 700 sccm, a pressure of 25 mTorr, and sufficient RF ICP power to activate the inert gas ions (e.g. about 300 W to 1000 W). An exemplary area of etchant reaction facilitated by the inert gas treatment cycle associated with FIG. 4C is indicated generally at 417, with similar areas being shown in FIG. 4E.

One explanation for how inert gas plasma treatment according to embodiments of the present disclosure may facilitate a higher bottom clean efficiency includes activation of unreacted etchant by the inert gas plasma. For example, the inert gas ions may activate the salt [e.g., $(NH_4)_2SiF_6$] at the bottom of a trench and release F ions such that the F ions facilitate removal of silicon oxide (e.g., $SiO_2$) at the bottom of the trench. Another explanatory mechanism for how inert gas plasma treatment according to embodiments of the present disclosure may facilitate a higher bottom clean efficiency includes physical bombardment of inert gas ions against reacted etchant byproducts so as to remove them, reducing top trench overhang and allowing fresh etchant to enter the bottom of a trench. Alternatively, or in addition, the latent heat of the inert gas plasma may anneal the by-product away to reveal fresh SiO2 at the bottom of the trench and allow more etchant to reach and more SiO2 to be etched at the bottom of the trench.

After performing an inert gas treatment cycle at block 320, the process sequence 300 returns to block 308 and the etch cycle counter m increments by one. FIGS. 4B, 4D and 4F depict consecutive etching cycles, while FIGS. 4C and 4E depict the reaction of additional etchant with exposed areas of material layer 404 within a trench following a respective inert gas plasma treatment cycle. If, at block 318, a determination is made that the final etch cycle has been performed at block 316, the process sequence proceeds to block 322. At block 322, the substrate 402 is heated to a second temperature to sublimate volatile byproducts of etching.

In an embodiment, the process sequence 300 further includes removing $(NH_4)_2SiF_6$ as an etchant byproduct by heating the substrate 402 to a second temperature to sublimate volatile byproducts, as in 322. A support member upon which the substrate may chucked may be elevated to an anneal position in close proximity to a heated gas distribution plate. The heat radiated from the gas distribution plate may dissociate or sublimate a thin film of the reaction byproduct $(NH_4)_2SiF_6$ into volatile $SiF_4$, $NH_3$, and HF products. These volatile products are then removed from the chamber by the vacuum pump as described above connection with FIG. 1. Typically, a temperature of 75° C. or more is used to effectively sublimate and remove the thin film from the substrate. In embodiments, a temperature of 90° C. or more is used, such as between about 90° C. and about 200° C. The substrate heating can be accomplished in the same process chamber or in another chamber if greater efficiency can be achieved by moving the heat and sublimation cycles elsewhere.

The process sequence 300 can further include flowing inert gas to evacuate the volatile byproducts from the chamber, as in 324. The thermal energy to dissociate the thin film of reaction byproduct $(NH_4)_2SiF_6$ into volatile constituents may be transferred by a gas distribution plate through convection or radiation. In one embodiment, the distribution plate is heated to a temperature of between 90° C. and 150° C., such as about 120° C. Further embodiments use a low energy plasma, such as a plasma as described with reference to the pretreatment process, to enhance the sublimation of volatile byproducts. The plasma is delivered to the surface of the substrate uniformly and at an energy level which will not sputter the oxides form the substrate. By using a low energy plasma while simultaneously heating the substrate, the activation energy for sublimation can be reduced. For example, a temperature of 120° C. over a certain time period may be appropriate for sublimation of a layer of the reaction byproduct $(NH_4)_2SiF_6$ having a certain thickness. By using a low energy plasma, the layer of reaction byproduct $(NH_4)_2SiF_6$ can be sublimated at 100° C. over the same time period or at 120° C. over a shorter time period.

Figure 4G:
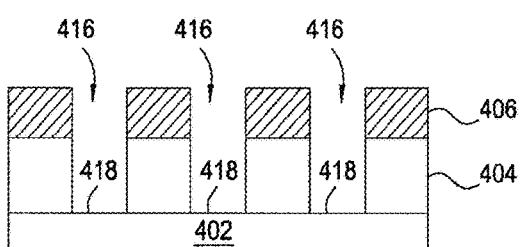

Once the film has been removed from the substrate, the process sequence 300 can be ended, as in 326. Thus, a substrate with fully defined trenches having a bottom clean efficiency (BCE) on the order of 70 to 80 percent, as shown in FIG. 4G, may be produced. The processing chamber is purged and evacuated. The processed substrate is then removed from the chamber by lowering the substrate member to the transfer position, de-chucking the substrate, and transferring the substrate through a slit valve opening.

In one embodiment, the low temperature plasma anneal process at block 322 utilizes a low RF power plasma treatment process to gently and mildly treat the substrate without damaging to the substrate surface. In one embodiment, the low temperature plasma process may use a low RF power, such as less than about 300 Watts, along with controlling the substrate temperature less than about 100 degrees Celsius, to sublimate the etching byproducts from the substrate surface. A plasma anneal process may be performed by supplying a plasma anneal gas mixture into the processing chamber 100. A may be formed from the plasma anneal gas mixture to plasma anneal the substrate 402, forming volatile gas byproducts which readily pumps out of the processing chamber 100.

In one embodiment, the plasma anneal gas mixture includes at least one of a hydrogen containing gas, a nitrogen containing gas, or an inert gas. The hydrogen containing gas, the nitrogen containing gas, or inert gas supplied in the plasma anneal gas mixture may promote prolongation of the lifetime of the ions in the plasma formed from the plasma anneal gas mixture. Such prolongation may improve the efficiency at which the etching byproduct(s) 412 are removed from the substrate 402. For example, the increased lifetime of the ions may facilitate a more thorough reaction and activation of the etching byproduct(s) 412 on the substrate 402.

In one embodiment, the hydrogen containing gas supplied into the processing chamber 100 includes at least one of $H_2$, $H_2O$, or the like. The nitrogen containing gas supplied into the processing chamber 100 includes at $N_2$, $N_2O$, $NO_2$, $NH_3$ and the like. The inert gas supplied into the processing chamber 100 includes at least one of Ar, He, Kr, or the like. In an exemplary embodiment, the hydrogen containing gas supplied in the processing chamber 100 to perform the treatment process is H2 gas, and the nitrogen containing gas supplied in the processing chamber 100 to perform the treatment process is N2 gas and the inert gas is He or Ar.

During the plasma anneal process, several process parameters may be regulated to control the pretreatment process. In one exemplary embodiment, a process pressure in the processing chamber 100 is regulated between about 10 mTorr to about 5000 mTorr, such as between about 10 mTorr and about 200 mTorr. RF power at a frequency of about 2 MHz to 30 MHz, with an exemplary frequency of 13.56 MHz may be applied to maintain a plasma in the treatment gas mixture. An RF power level of about 20 W to about 1500 W (e.g, 300 W) may be applied to maintain a plasma inside the processing chamber 100. The anneal gas mixture may be flowed into the chamber at a rate between about 10 sccm to about 10000 sccm. A substrate temperature may be maintained at less than 500 degrees Celsius, for example between about 90 degrees Celsius to about 100 degrees Celsius.

While the foregoing is directed to embodiments of the present disclosure, other and further embodiments consistent with the present disclosure may be devised without departing from the basic scope thereof.

The invention claimed is:

1. A method for forming a feature on a substrate by etching a trench with high bottom clean efficiency, comprising:
   positioning a substrate in a processing chamber;
   generating, in a first etching cycle, a plasma from a gas or gas mixture within the processing chamber to form a processing gas including an etchant;
   exposing, to the etchant, at least a portion of a material layer disposed on the substrate while maintaining the substrate at a first temperature;
   subsequently generating an inert gas plasma within the processing chamber by providing an RF source power at a power level of 300 W to 1000 W while generating the inert gas plasma;
   subsequent to generating the inert gas plasma, generating, in a second etching cycle, a plasma from a gas mixture within the processing chamber to form the processing gas including an etchant; and
   heating the substrate to a second temperature higher than the first temperature to sublimate at least one byproduct of reaction between the etchant and a material layer disposed on the substrate.

2. The method of claim 1, wherein the material layer exposed to the etchant comprises a dielectric material.

3. The method of claim 2, wherein the dielectric material includes at least one of an oxide, a nitride, or a nitride layer disposed between oxide layers.

4. The method of claim 1, wherein the plasma is generated from at least one of ammonia ($NH_3$) or nitrogen trifluoride ($NF_3$).

5. The method of claim 1, wherein the plasma is generated from a mixture of gases comprising $NH_3$ and $NF_3$.

6. The method of claim 1, wherein the inert gas plasma is generated from at least one of helium (He), argon (Ar), or krypton (Kr).

7. The method of claim 1, wherein the substrate and inert gas plasma are maintained within a vacuum processing region of the processing chamber at a pressure of less than 300 millitorr (mTorr).

8. The method of claim 7, wherein the substrate and inert gas plasma are maintained within the vacuum processing region of the processing chamber at a pressure of from about 10 mTorr to about 150 mTorr.

9. The method of claim 1, wherein the substrate and inert gas plasma are maintained within a vacuum processing region of the processing chamber at a pressure of less than 300 millitorr (mTorr).

10. The method of claim 9, wherein the substrate and inert gas plasma are maintained within the vacuum processing region of the processing chamber at a pressure of from about 10 mTorr to about 150 mTorr.

11. The method of claim 1, wherein the method further comprises, prior to the heating,
   generating, in a second inert gas plasma generating cycle, the inert gas plasma within the processing chamber; and
   generating, in a third etching cycle, a plasma from a gas mixture within the processing chamber to form the processing gas including an etchant.

12. The method of claim 1, further comprising forming a plasma during the heating of the substrate to the second temperature via application of about 300 W to about 1000 W of RF power.

13. A method for forming a feature on a substrate by etching a trench with high bottom clean efficiency, comprising:
   positioning the substrate in a vacuum processing region of a processing chamber;
   during a first etching cycle, exposing at least one portion of the substrate to an etchant while maintaining the substrate below a temperature threshold;
   subsequently bombarding the at least one portion with ions of an inert gas plasma by providing an RF source power at a power level of 300 W to 1000 W while generating the inert gas plasma, while maintaining the substrate below the temperature threshold, to at least one of:
      activate unreacted etchant by the inert gas plasma,
      physically remove etchant byproducts, formed by reaction of the etchant and regions of the at least one portion, to reduce top trench overhang, or
      anneal away etchant byproducts, formed by reaction of the etchant and regions of the at least one portion, via latent heat of the inert gas plasma to unreacted portions of the substrate reveal fresh surfaces of the substrate at the bottom of a trench and allow more substrate material to be etched at the bottom of the trench; and
   subsequently heating the substrate to a second temperature higher than the temperature threshold to sublimate at least one etchant byproduct.

14. The method according to claim 13, further comprising:
   exposing, to the etchant, portions of the substrate exposed by removal of etchant byproducts during the bombarding, while maintaining the substrate below a temperature threshold.

15. The method of claim 13, wherein exposing of the substrate to at least one of the etchant or the inert gas plasma is performed at a temperature of less than 90 degrees Celsius.

16. The method of claim 13, wherein exposing of the substrate to at least one of the etchant or the inert gas plasma is performed at a temperature of from about 30 to about 50 degrees Celsius.

17. The method of claim 13, wherein each of the etchant and inert gas ions are respectively produced by operating an RF power source.

18. A method for forming a feature on a substrate by etching a trench with high bottom clean efficiency, comprising, in order:
   (a) generating a plasma from a gas or gas mixture within a processing chamber to form a processing gas including an etchant and exposing at least a portion of a material layer disposed on the substrate to the etchant while maintaining the substrate at a first temperature;
   (b) subsequently generating an inert gas plasma within the processing chamber by providing an RF source power at a power level of 300 W to 1000 W while generating the inert gas plasma;
   (c) subsequent to (b), repeating (a); and
   (d) only after (c), heating the substrate to a second temperature higher than the first temperature, to sublimate at least one byproduct of reaction between the etchant and a material layer disposed on the substrate.

* * * * *